United States Patent
Leung et al.

(10) Patent No.: US 6,283,770 B1
(45) Date of Patent: Sep. 4, 2001

(54) MINIMAL INTRUSION EMI SHIELDING CLIP TO MAINTAIN ELECTRICAL CONTACT BETWEEN TWO PARALLEL SURFACES

(75) Inventors: Jimmy Che-Kin Leung, Fremont, CA (US); Scott A. Eastman, Cary, NC (US); Douglas J. Hurst, Boulder, CO (US)

(73) Assignee: Cisco Technology, Incc., San Jose, CA (US)

( * ) Notice: Subject to any disclaimer, the term of this patent is extended or adjusted under 35 U.S.C. 154(b) by 0 days.

(21) Appl. No.: 09/210,353

(22) Filed: Dec. 11, 1998

(51) Int. Cl.[7] ................................................... H01R 4/66
(52) U.S. Cl. ................................ 439/92; 174/35; 361/818
(58) Field of Search ........................... 439/92, 435–441, 439/444, 858, 861, 387, 517, 607; 361/818, 800; 174/35

(56) References Cited

U.S. PATENT DOCUMENTS

| | | | |
|---|---|---|---|
| 3,478,303 | * 11/1969 | Dauser | 439/92 |
| 3,528,050 | * 9/1970 | Hindenburg | 439/92 |
| 4,087,149 | * 5/1978 | Fischer | 439/92 |
| 4,186,981 | * 2/1980 | Holton | 439/92 |
| 4,944,692 | * 7/1990 | Allina | 439/517 |
| 5,022,873 | * 6/1991 | Kollmann | 439/92 |
| 5,083,936 | * 1/1992 | Yang | 439/441 |
| 5,118,307 | * 6/1992 | Knoop et al. | 439/607 |
| 5,233,507 | * 8/1993 | Gunther | 361/818 |
| 5,451,167 | * 9/1995 | Zielinski | 439/92 |
| 5,453,028 | * 9/1995 | Grambley et al. | 439/441 |
| 5,746,326 | * 5/1998 | Hong | 211/41.17 |

* cited by examiner

Primary Examiner—Brian Sircus
Assistant Examiner—J. F. Duverne
(74) Attorney, Agent, or Firm—Blakely, Sokoloff, Taylor & Zafman LLP

(57) ABSTRACT

An apparatus for providing EMI shielding. A conductive clip has a first jaw and a second jaw with an elbow between. The first jaw has a major surface with a detent formed on the major surface and defining a discontinuity in the major surface. The second jaw forms a contact hump disposed along the second jaw between two contact segments.

9 Claims, 2 Drawing Sheets

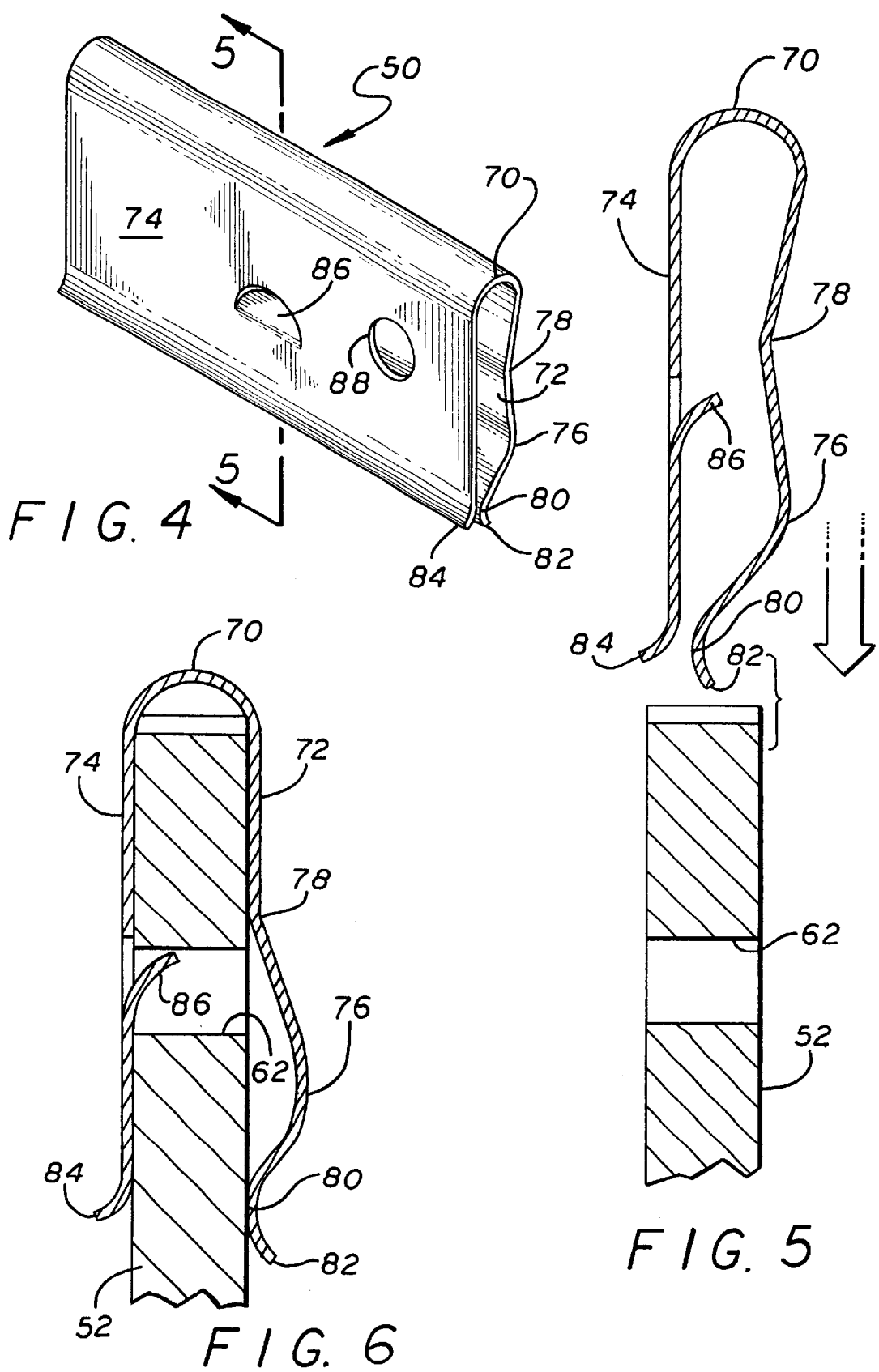

MINIMAL INTRUSION EMI SHIELDING CLIP TO MAINTAIN ELECTRICAL CONTACT BETWEEN TWO PARALLEL SURFACES

BACKGROUND OF THE INVENTION (1) Field of the Invention

The invention relates to EMI shielding. More specifically, the invention relates to an EMI shielding clip.

(2) Background

The Federal Communications Commission (FCC) has promulgated various electromagnetic interference (EMI) emissions limitations for sources of EMI. Such sources include typical computers and other common electronic equipment. Typically, such EMI sources reside in a conductive chassis which, when grounded, blocks the EMI emissions. Gaps in the chassis such as openings for insertable modules or where the parts of the housing do not meet to form a conductive path, constitute possible leaks for EMI emissions. In an effort to satisfy EMI regulations, various shielding techniques have been developed.

FIG. 1 shows one prior art EMI D-clip. D-clip 10 can be used for shielding gaps in slide-in type modules. Typically, the ends 14 of the D-clip are inserted through two slots in the sheet metal. The natural spring force of the metal of D-clip 10 causes the arc 12 of D-clip 10 to engage an adjacent part of the chassis. Unfortunately, the deflection that occurs when the D-clip 10 engages the chassis causes the ends 14 to intrude in the area above circuit board components. This intrusion may cause the spacing required between electrical components and ground to be compromised. Additionally, to install the D-clip, it is necessary to elastically deform it so that the ends 14 can engage the slots in the sheet metal. Once the ends have engaged the slots, the natural spring forces in the D-clip 10 hold it in place. Unfortunately, this required deformation complicates installation, typically requiring both hands and possibly increasing manufacturing costs.

FIG. 2 shows a prior art perpendicular grounding clip. The perpendicular grounding clip 20 is less intrusive than the prior art D-clip but frequently fails to maintain a good contact because it was not designed for ensuring contact between parallel surfaces. The perpendicular grounding tab 24 necessitates a single orientation of installation. Detent 22 engages a slot in the module but is subject to easy dislodgment if an edge 26 is snagged during installation or deinstallation of the module. Surfaces of the dips 16 and 18 often do not provide adequate contact between the module and the chassis to provide the necessary EMI shielding.

BRIEF SUMMARY OF THE INVENTION

An apparatus for providing EMI shielding is disclosed. A conductive clip has a first jaw and a second jaw with an elbow between. The first jaw has a major surface with a detent formed on the major surface and defining a discontinuity in the major surface. The second jaw forms a contact hump disposed along the second jaw between two contact segments.

BRIEF DESCRIPTION OF THE DRAWINGS

FIG. 4 is a perspective view of a clip of one embodiment of the invention.

FIG. 5 shows a sectional view of a clip of one embodiment of the invention prior to installation.

FIG. 6 is a sectional view of the clip of one embodiment of the invention installed.

DETAILED DESCRIPTION

As will be discussed in more detail below, an EMI shielding clip of one embodiment maintains good contact between two parallel surfaces. It is an intended advantage of the embodiment that the clip be minimally intrusive. It is a further intended advantage that the embodiment be easily installed and relatively difficult to dislodge once installed. It is a further intended advantage of the embodiment to reduce EMI emission relative to existing shielding clips.

Figure 3:
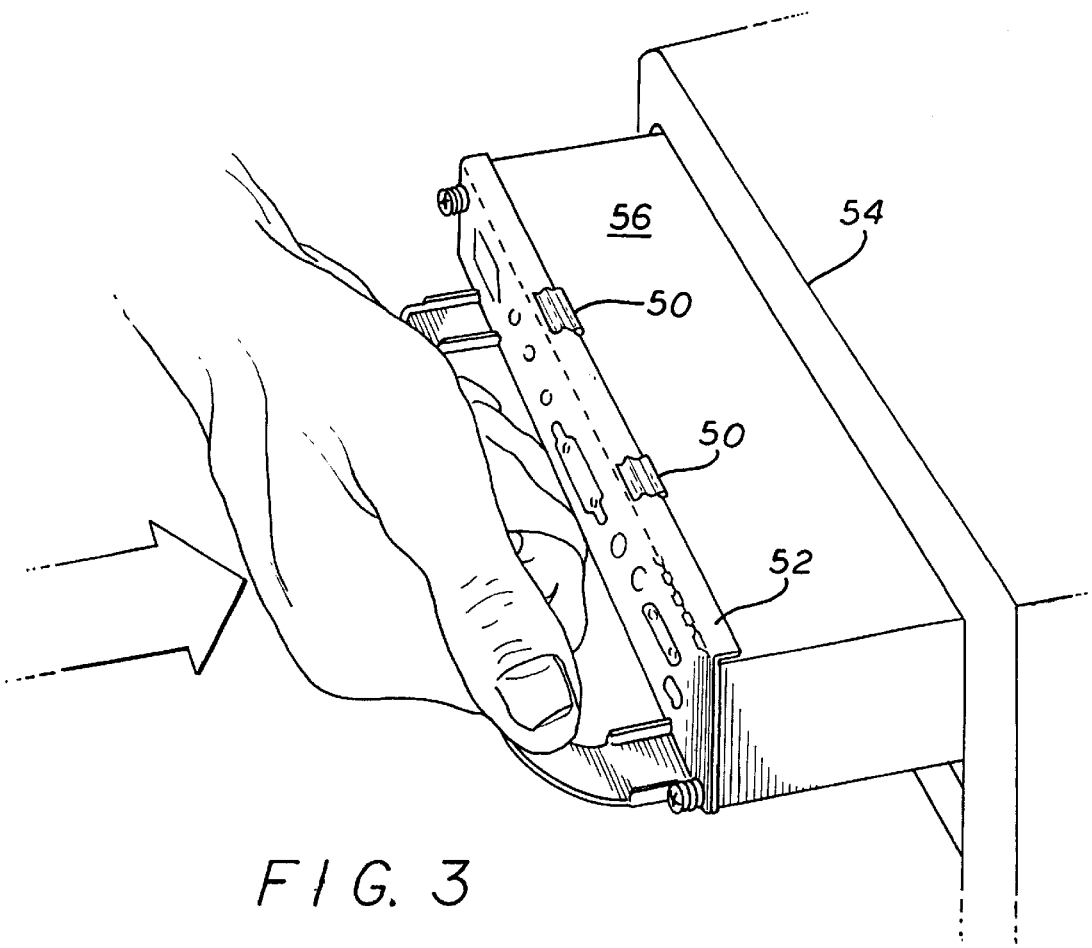
FIG. 3 is a schematic view of an insertable module being inserted into a chassis.

FIG. 3 shows an insertable module being inserted into a chassis. Insertable module 56 has a pair of clips 50 of one embodiment of the invention inserted on an upper edge 52. Upper edge 52 is parallel and adjacent to an edge of the chassis 54 once the module 56 is inserted. To provide appropriate EMI shielding, clips 50 should maintain good contact between the two parallel surfaces of edge 52 and the edge of chassis 54. Clips 50 may also be employed in the context of a chassis housing, where the housing comes together. Generally, anywhere contact is to be maintained between two parallel adjacent surfaces, clips 50 may be used.

FIG. 4 is a perspective view of a clip of one embodiment of the invention. Clip 50 has a first jaw 74 coupled to a second jaw 72 by an elbow 70. In one embodiment, the first jaw 74, second jaw 72, and elbow are a unitary conductor folded at the elbow. The first jaw 74 terminates in a lip 84 having a first radius of curvature. The first jaw 74 has a substantially planar major surface located between the lip 84 and the elbow 70. The substantially planar major surface of first jaw 74 has a detent 86 formed therefrom defining a discontinuity in the major surface. In one embodiment, the major surface also defines a tooling hole 88.

The second jaw 72 is characterized by a plurality of bends which create a contact hump 76 between contact segments 78 and 80. When installed, the contact segments 70 and 80 contact the surface of an edge on which the clip is installed while contact hump 76 contacts the adjacent parallel surface. Second jaw 72 terminates in a lip 82 having a second radius of curvature.

FIG. 5 shows a sectional view of a clip of one embodiment of the invention prior to installation. As reflected in the drawing, detent 86 protrudes inwardly from the major surface of first jaw 74. Lip 84 has a smaller radius of curvature than lip 82. Because lip 84 is typically in a protected location after installation, the smaller radius of curvature of lip 84 facilitates installation without increasing the risks of snagging and subsequent deinstallation of the clip. By having the greater radius of curvature of lip 82, the risk of snagging on the exposed surface is further reduced. Moreover, because the detent 86 is on the protected jaw, even if lip 82 snags, the likelihood of dislodging the clip from its installed position is greatly reduced. Significantly, the clip is easily installed with one hand as the curve of the lips 82, 84 guide the edge between the jaw without the need to deform the clip in advance of installation.

Additionally, because the major surface is substantially planar, the clip is minimally intrusive with its intrusion being limited to the thickness of the conductive material forming the first jaw except at the first lip. Thus, this clip does not suffer the infirmity of the D-clip relative to component spacing.

FIG. 6 is a sectional view of the clip of one embodiment of the invention installed. The major surface of first jaw 74 remains in planar contact with edge 52. The detent 86 engages a hole 62 in edge 52 and retains the clip as installed. The natural elasticity of the material used form the clip, and allows the clip to expand to accept the edge 52 between the jaws 74, 72. Jaw 72 contacts the edge along contact segment 78 and 80 which run the length of the clip. The radius of curvature of elbow 70 affects the maximum thickness of edge 52 that can be accepted by the dip. Contact hump 76 will be the highest point on jaw 72 relative to edge 52. Thus, contact hump 76 will engage a parallel adjacent conductor, creating a conductive path between edge 52 and the parallel conductor. Typically, the parallel adjacent conductor will be in sufficient proximity to edge 52 in an installed position that contact hump 76 will be compressed somewhat. The natural spring forces will then ensure a firm contact. Suitable materials exhibit high conductivity and flexible resiliency to ensure a firm contact. In one embodiment of the invention, a beryllium copper alloy (BeCu) is employed. Numerous other suitable materials exist.

Figure 1:
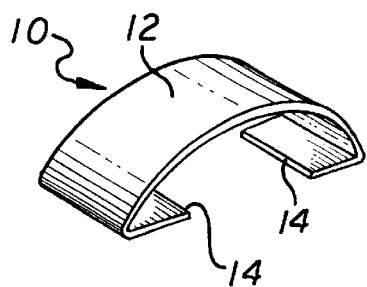
FIG. 1 is a perspective view of a prior art traditional EMI D-clip.
Figure 2:
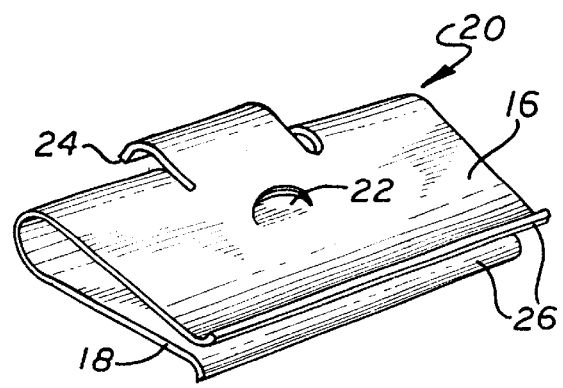
FIG. 2 is a perspective view of a prior art perpendicular grounding clip.

In one embodiment of the invention, a long dimension of the clip 50 is approximately 0.5 inches. The center of the detent is 0.25 inches from either edge. The elbow 70 has a radius of curvature of 0.25 inches. In a relaxed configuration such as shown in FIG. 5, the mouth of the clip is 0.012 inches wide. The linear dimension from apex of the elbow 70 to the end of the first lip 84 is 0.238 inches. The linear dimension from the apex of the elbow 70 to the second lip 82 is 0.249 inches. The distance from the major surface to first contact segment 78 is approximately 0.039 inches, while the distance between the major contact surface and the peak of the elbow arc is 0.057 inches. The distance from the major surface to the contact hump 76 is 0.051 inches. Finally, the linear distance from the apex of the elbow 70 to the apex of the detent 86 is approximately 0.123 inches, up to plus 0.010 inches or minus 0.005 inches. This embodiment can be suitably manufactured out of 0.0035 inch thickness BeCu alloy and achieves a five decibel noise reduction over the perpendicular prior art clip of FIG. 2. Additionally, it has been found that this embodiment carriers lower manufacturing cost per unit than the prior art perpendicular grounding clip described above and shown in FIG. 2.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A contact clip comprising:

a first jaw having a major surface and a detent formed as a discontinuity in the major surface, the detent biased toward an interior of the clip;

a second jaw forming a contact hump between a first contact segment and a second contact segment; and an elbow integrally formed with the first jaw and second jaw and joining the first jaw and second jaw together, the elbow having a radius of curvature of approximately 0.025 inches.

2. The contact clip of claim 1 wherein the first jaw terminates in a first lip having a first radius of curvature and the second jaw terminates in an second lip having a second radius of curvature.

3. The contact clip of claim 2 wherein the first radius of curvature is smaller than the second radius of curvature.

4. The contact clip of claim 1 wherein the major surface is substantially planar.

5. The contact clip of claim 1 wherein a long dimension of the chip is approximately 0.5 inches and the detent is centrally located relative to the long dimension.

6. The contact clip of claim 1 wherein the clip is formed from a 0.0035 inch thick BeCu alloy.

7. The contact clip of claim 1 wherein the first contact segment and the second contact segment are defined by a first bend and a second bend in a conductor forming the second jaw.

8. A contact clip comprising:

a unitary conductor folded at an elbow to form a first jaw and a second jaw, the elbow having a radius of curvature of approximately 0.025 inches;

the first jaw having disposed thereon a detent and terminating in an edge having a curve away from the second jaw of a first radius of curvature; and the second jaw having formed as a part thereof a contact hump, the upper jaw terminating in an edge having a curve away from the first jaw of a second radius of curvature.

9. A contact clip comprising:

a first jaw having a major surface and a detent formed as a discontinuity in the major surface, the detent biased toward the interior of the clip to engage a conductor inserted between a first jaw and a second jaw;

a second jaw forming a contact hump to engage a conductor external to the jaws; and an elbow integrally formed with the first jaw and second jaw and joining the first jaw and second jaw together.

* * * * *